United States Patent [19]

Sevastopoulos et al.

[11] 4,417,214

[45] Nov. 22, 1983

[54] MONOLITHIC IC GENERAL PURPOSE ACTIVE FILTER

[75] Inventors: Stylianos G. Sevastopoulos, San Jose; Sammy S. Lum, Santa Clara, both of Calif.

[73] Assignee: National Semiconductor Corporation, Santa Clara, Calif.

[21] Appl. No.: 253,233

[22] Filed: Apr. 13, 1981

[51] Int. Cl.³ ............................ H03F 1/34; H03F 3/68
[52] U.S. Cl. ....................................... 330/84; 330/107; 330/124 R
[58] Field of Search ................... 330/107, 109, 124 R, 330/84; 328/167; 333/173; 307/520

[56] References Cited

U.S. PATENT DOCUMENTS 4,306,197 12/1981 Gregorian ........................... 330/107

OTHER PUBLICATIONS

Girling et al., "Active Filters: 7. The Two-Integrator Loop", *Wireless World*, Feb. 1970, pp. 76-80.
Martin, "Improved Circuits for the Realization of Switched Capacitor Filters", *Proceedings of 1979 IS-CAS*, Jul. 1979, pp. 756-759.

Primary Examiner—James B. Mullins
Attorney, Agent, or Firm—Brown & Martin

[57] ABSTRACT

A general purpose active filter which can be fabricated as a single, monolithic IC. The IC includes two independent filter building blocks. Each filter block includes a pair of serially connected summers and a pair of serially connected switched capacitor positive integrators connected to the serial output of the summers. The IC further includes clock interface circuitry for receiving and conditioning first and second external clock signals. The interface circuitry drives the switches of the positive integrators of each filter block with one of the first and second conditioned clock signals. A plurality of input and output leads are interconnected with the components of each filter block to permit the filter blocks to be separately configured to perform various second order filter functions. The filter blocks may be tuned according to external resistance ratios and/or according to the frequencies of the external clock signals.

3 Claims, 14 Drawing Figures

MONOLITHIC IC GENERAL PURPOSE ACTIVE FILTER

BACKGROUND OF THE INVENTION

The present invention relates to filters, and more particularly, to integrated circuit active filters.

In general, a filter is a two port network which is designed to freely transmit signals within one or more frequency bands and to attenuate signals of other frequencies. Conventional filters comprise networks of resistors, inductors and capacitors. The recent availability of integrated circuit (IC) operational amplifiers (op amps) has made it possible to simulate the electrical characteristics of R-L-C networks by using only resistors and capacitors. An op amp with capacitive feedback can be designed to act like an inductance or a complete L-C network. This approach eliminates bulky inductors and ferromagnetic effects. Filters of this type are called active filters. Their main advantages are that they can be designed to have no insertion loss, and that they can be constructed in much smaller volumes than their passive counterparts.

The op amp in an active filter is a high gain amplifier which has an inverting and a non-inverting input. The ideal op amp has infinite input resistance, infinite gain and zero output resistance. However, in actual IC's these characteristics cannot be fully achieved. Nevertheless, IC op amps are available that provide very high input impedance, very large amplification and very low output impedance over a useful frequency band. Active filter design involves the application of modern network theory. Usually, either Butterworth or Chevishev filters are implemented, although other filters can also be obtained.

Low pass, high pass and band pass filters are classified into degrees of complexity. In general, second order filters are considered the simplest. The signal inverting multiple feedback (MFB) and the nonsignal inverting voltage controlled voltage source (VCVS) are widely used circuits in active filters.

In the past, there has been available from National Semiconductor Corporation, the assignee of the present application, a general purpose second order active filter sold under the designation AF100. Four external resistors program the AF100 for specific second order functions. Low pass, high pass and band pass functions are available simultaneously at separate outputs. Notch and all pass functions are available by summing the outputs in the uncommitted output summing amplifier. Higher order filters are achieved by cascading several AF100 active filters with appropriate programming resistors. Any of the classical filter configurations, such as Butterworth, Bessel, Cauer, and Chevishev can be formed with the AF100.

The aforementioned AF100 active filter represents an improvement over conventional filter design in that it does not utilize any inductances. Furthermore, it comes in one convenient package that can be readily programmed with external resistors to provide a wide range of useful second order filter functions.

Prior art active filters have frequently been difficult to tune. Furthermore, they have had a hybrid construction incorporating both IC and discrete components. This has made them relatively large in size and high in cost.

It would be desirable to provide a monolithic IC general purpose active filter that could be readily programmed for specific second order functions. If such an active filter could perform an all pass function, it could be utilized for phase correction in a wide variety of signal processing applications, for example, in high speed modems used in communications systems. Such a monolithic IC general purpose active filter could be produced at relatively low cost and would be relatively small in size. Preferably, this monolithic active filter would have improved tuning capabilities.

SUMMARY OF THE INVENTION

The present invention provides a general purpose active filter which can be fabricated as a single, monolithic IC. The IC includes two independent filter building blocks. Each filter block includes a pair of serially connected summers and a pair of serially connected switched capacitor positive integrators connected to the serial output of the summers. A first one of the summers includes an op amp while the second summer includes a plurality of interconnected capacitors and switches. The IC further includes clock interface circuitry for receiving and conditioning first and second external clock signals. The interface circuitry drives the switches of each filter block with one of the first and second conditioned clock signals. A plurality of input and output leads are interconnected with the components of each of the filter blocks and permit each block to be independently configured.

Each of the filter blocks, together with a corresponding external clock signal and three to four external resistors, can be interconnected to produce various second order filter functions. The filter building blocks each have three outputs. One of the outputs can be configured to perform either an all pass, a high pass, or a notch function. The remaining two outputs perform low pass and band pass functions. The center frequency of the low pass and band pass second order functions can be either directly dependent on the clock frequency, or they can depend on both clock frequency and external resistor ratios. The center frequency of the notch and all pass functions is directly dependent on the clock frequency while the high pass center frequency depends on both resistor ratios and clock frequency. Up to fourth order filter functions can be performed by cascading the two second order filter building blocks. Any of the classical filter configurations, such as Butterworth, Bessel, Cauer and Chevishev can be obtained.

DESCRIPTION OF THE PREFERRED EMBODIMENTS

Figure 1:
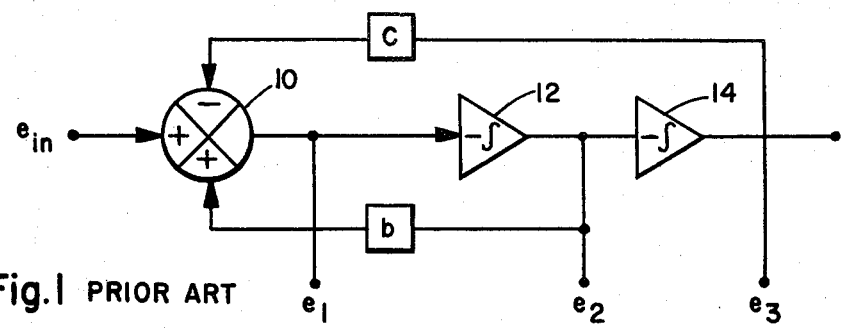
FIG. 1 is a functional block diagram of a prior art general purpose active filter.

FIG. 1 is a functional block diagram of the prior art AF100 general purpose state variable active filter. It may be programmed with external resistors to obtain specific second order filter functions. The input signal $e_{in}$ is fed to a summer 10 whose output is connected to the input of a first negative integrator 12. The output of the first negative integrator is fed to the input of the second negative integrator 14. Resistor networks b and c are coupled externally of the filter package by the user to provide the coefficients of the desired transfer functions. High pass, band pass, and low pass functions are available at outputs $e_1$, $e_2$ and $e_3$, respectively.

Figure 2:
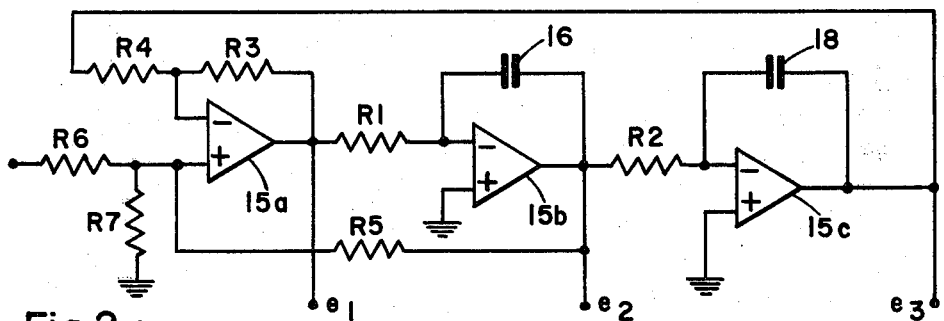
FIG. 2 is a schematic diagram of the prior art active filter of FIG. 1.

FIG. 2 is a schematic diagram of the active filter circuit of the prior art AF100 device. In actual construction, a die containing four op amps is mounted on a ceramic plate. Three of these op amps 15a, 15b, and 15c are utilized in the active filter circuit while the fourth op amp is available for other functions that the user may require. The op amp 15a is utilized as the summer 10 (FIG. 1) while the op amps 15b and 15c (FIG. 2) are included in the negative integrators 12 and 14 (FIG. 1). The resistors $R_1$, $R_2$, $R_6$, and $R_7$ are external resistors selected by the user to configure the filter in the desired manner. The resistors $R_3$, $R_4$ and $R_5$ are internal resistors of the AF100 device. They are thin film resistors which are deposited on the ceramic plate adjacent the quad op amp chip. The values of the internal resistors $R_3$, $R_4$ and $R_5$ are critical to the performance of the active filter circuit. Capacitors 16 and 18 are also discrete components which are mounted on the ceramic plate. They have a value of approximately one thousand picofarads. The components on the ceramic plate are interconnected by aluminum conductors.

It is not practical to construct the active filter circuit of FIG. 2 on a single, monolithic IC chip. This is because the internal resistors $R_3$, $R_4$ and $R_5$ would then have to be of the diffusion type. Due to manufacturing tolerances, it would be difficult to uniformly maintain the resistances of diffusion type resistors close enough to the critical values required from chip to chip. Furthermore, the needed value of the capacitors 16 and 18 would require an excessive amount of die area if they were formed in the architecture of a monolithic IC.

In order to eliminate the necessity of utilizing thin film deposited resistors $R_3$, $R_4$ and $R_5$ (FIG. 2) as well as the capacitors 16 and 18, the active filter circuit of the present invention utilizes switched capacitor positive integrators.

Figure 3:
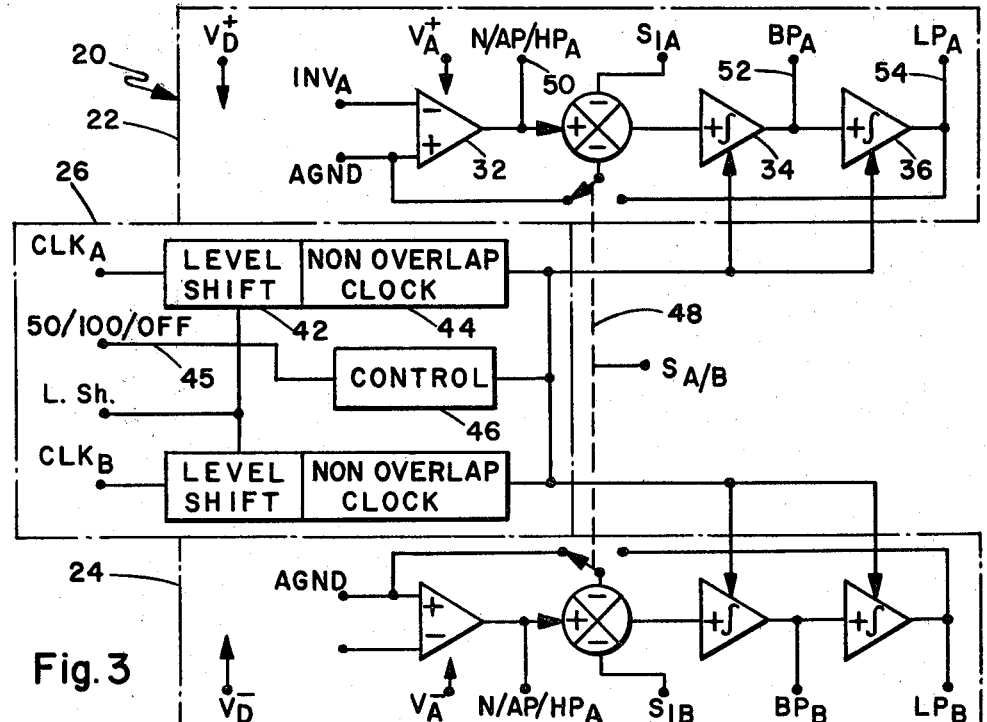
FIG. 3 is a functional block diagram of the general purpose active filter of the present invention.
Figures 4, 5:
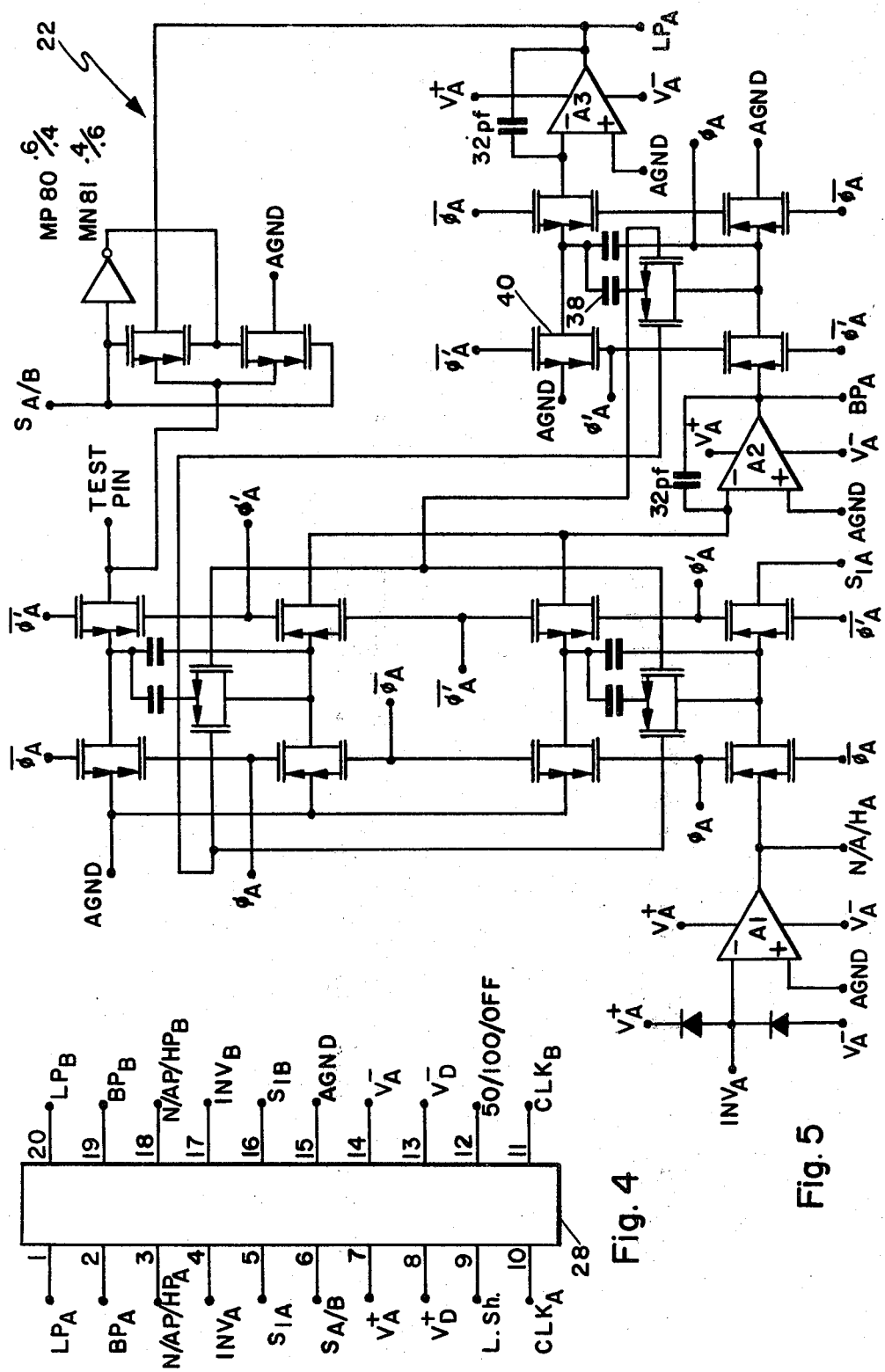
FIG. 4 illustrates a dual-in-line package in which a monolithic IC incorporating the active filter circuit of FIG. 3 may be mounted.
FIG. 5 is a schematic diagram illustrating details of one of the filter building blocks of the active filter circuit of FIG. 3.

FIG. 3 is a functional block diagram of the general purpose active filter 20 of the present invention which may be constructed as a single, monolithic IC. It includes a pair of identical active filter building blocks 22 and 24 which are driven by clock interface circuitry 26. As set forth hereafter, the blocks 22 and 24 may be programmed by the user by selecting the required ratio of externally applied resistors and the required frequency of a pair of external clock signals in order to obtain predetermined second order filter functions. Any of the classical filter configurations, such as Butterworth, Bessel, Cauer and Chebishev can be obtained. The single, monolithic IC incorporating the circuit of FIG. 3 may be mounted in a twenty pin dual-in-line package 28 (FIG. 4). The alphanumeric designations on the pins of the package 28 correspond to the similarly denoted leads of the circuit of FIG. 1.

Referring to FIG. 3, each of the building blocks such as 22 includes first and second serially connected summers 30 and 32. Each block further includes first and second serially connected switched capacitor positive integrators 34 and 36 connected to the serial output of the summers.

FIG. 5 is a schematic diagram illustrating details of the filter building block 22 which is identical to the filter building block 24. As shown in FIG. 5, the summer 30 comprises an op amp $A_1$. The positive integrators 34 and 36 are of the switched capacitor type and include op amps $A_2$ and $A_3$, respectively as well as a plurality of interconnected capacitors such as 38 and switches such as 40. The switches 40 are driven by the clock interface circuitry 26 of (FIG. 3).

Figure 6:
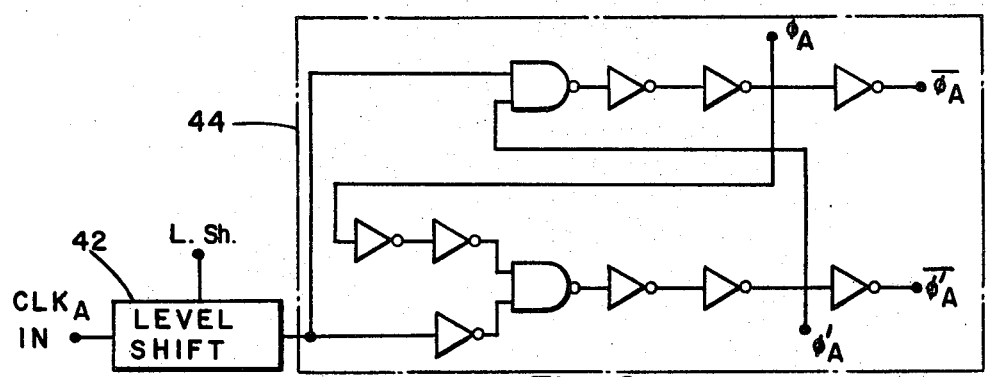
FIG. 6 is a schematic diagram of a portion of the clock interface circuitry of the active filter of FIG. 3.

FIG. 6 is a schematic diagram of one-half of the clock interface circuitry 26 which is utilized in connection with the filter building block 22. The other half of the circuitry 26 is identical and is utilized in connection with the filter building block 22. The function of the circuitry of FIG. 6 is to receive and condition an external clock signal such as $CLK_A$, and to drive the switched capacitor positive integrators 34 and 36 as well as the second summer 32 with the conditioned clock signal. Either a TTL level or CMOS level digital clock signal is fed through level shift circuitry 42 to a series of gates which comprise the non-overlap circuitry 44. The level shift pin (L.Sh.) may be grounded or connected to the I.C. negative supply to accommodate $T^2L$ or CMOS clock level inputs. The function of the non-overlap circuitry 44 is to invert the external clock signal and introduce delays in order to give a two phase clock signal with non-overlap that will enable the switches of the second summer 32 and of the positive integrators 34 and 36 to be driven without introducing errors. The output of the circuitry 44 is two separate signals $\phi A$ and $\phi'A$. These signals are fed to various points in the circuitry of the building block 22 as shown by the corresponding designations in FIG. 5.

The 50/100/OFF input pin 45 (FIGS. 3 and 4) is connected to a control circuit 46 (FIG. 3). The control circuit 46 comprises a three level digital comparator circuit which controls the ratio of the clock frequency to the center frequency of the filter. If the pin 45 is pulled high, the aforementioned ratio will be fifty to one. If the pin 45 is pulled to an intermediate level, the ratio of the clock frequency to the center frequency of the filter will be one hundred to one. If the pin 45 is pulled low, the circuitry of the filter blocks 22 and 24 will be shut down. This may be done in applications where the filter is not used at certain times in order to conserve power.

The input $S_{A/B}$ (FIG. 3) is commonly connected to both of the second summers 32 of the filter blocks as indicated by the phantom line 48. This is a practical limitation dictated by the fact that the dual-in-line package 28 (FIG. 4) has only twenty pins available. In some instances, this common connection may limit the ability to configure the filter blocks separately. This shortcoming does not pose a problem in most applications. It may be overcome by providing a package with more pins.

As shown in FIGS. 3–6, the filter 20 is provided with a plurality of input and output leads that are interconnected with the various active and passive components of the circuitry. These leads provide a means for permitting the filter to be configured and tuned as hereafter described in greater detail. Each of the filter blocks, together with a corresponding external clock signal and three to four external resistors, can be interconnected to produce various second order filter functions. The filter building blocks each have three output pins 50, 52 and 54 (FIG. 3). The output 50 can be configured to perform either an all pass, a high pass, or a notch function. The remaining two outputs 52 and 54 perform band pass and low pass functions, respectively. The center frequency of the low pass and band pass second order functions can be either directly dependent on the clock frequency, or they can depend on both clock frequency and external resistor ratios. The center frequency of the notch and all pass functions is directly dependent on the clock frequency while the high pass center frequency depends on both resistor ratios and clock frequency. Up to fourth order filter functions can be performed by cascading the two second order filter building blocks.

The filter 20 (FIG. 3) may be fabricated as a single monolithic IC incorporating MOS components. The MOS fabrication process has the advantages of low cost and high yield.

The various ways in which the active filter of the present invention may be configured can be more readily explained by adopting the following definition of terms:

Definition of Terms $f_{clk}$ = The switched capacitor filter external clock frequency.

Figure 7:
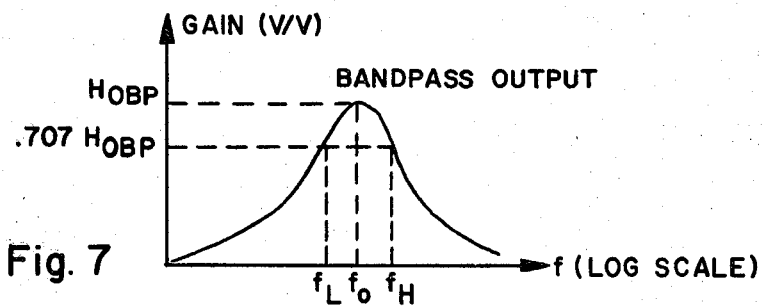
FIGS. 7-9 are graphs utilized in conjunction with the definition of terms set forth herein.

$f_o$ = Center frequency of the second order function complex pole pair; $f_o$ is measured at the band pass output of each filter building block 22 and 24. It is the frequency of the band pass peak occurrence (FIG. 7).

$Q_p$ = Quality factor of the second order function complex pole pair; $Q_p$ is also measured at the band pass output of each filter block. It is the ratio of $f_o$ over the −3dB bandwidth of the second order band pass filter (FIG. 7). The value of $Q_p$ is not measured at the low pass or high pass outputs of the filter. Its value relates to the possible amplitude peaking at the above outputs.

$H_{OBP}$ = The gain in (V/V) of the band pass output at $f=f_o$.

$$Q_p = \frac{f_o}{f_2 - f_1} \; ; f_o = \sqrt{f_1 f_2}$$

$$f_L = f_o \left( \frac{-1}{2Q_p} + \sqrt{\left(\frac{1}{2Q_p}\right)^2 + 1} \right)$$

$$f_H = f_o \left( \frac{1}{2Q_p} + \sqrt{\left(\frac{1}{2Q_p}\right)^2 + 1} \right)$$

Figure 8:
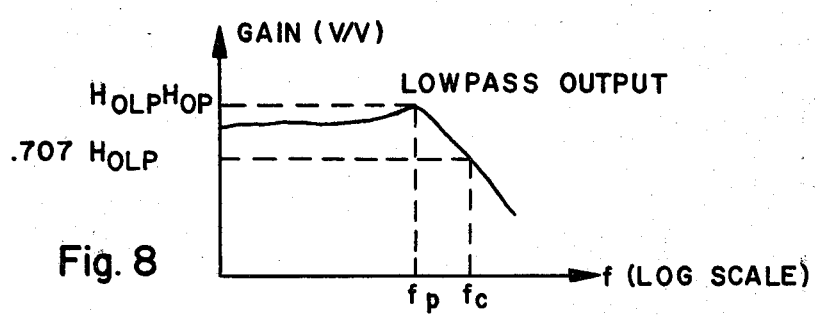

$H_{OLP}$ = The gain in (V/V) of the low pass output of each filter block at f→0Hz (FIG. 8).

$$f_c = f_o \times \sqrt{\left(1 - \frac{1}{2Q_p^2}\right) + \sqrt{\left(1 - \frac{1}{2Q_p^2}\right)^2 + 1}}$$

-continued $$f_p = f_o \sqrt{1 - \frac{1}{2Q_p^2}}$$

$$H_{op} = H_{OLP} / \frac{1}{Q_p} \sqrt{1 - \frac{1}{4Q_p^2}}$$

Figure 9:
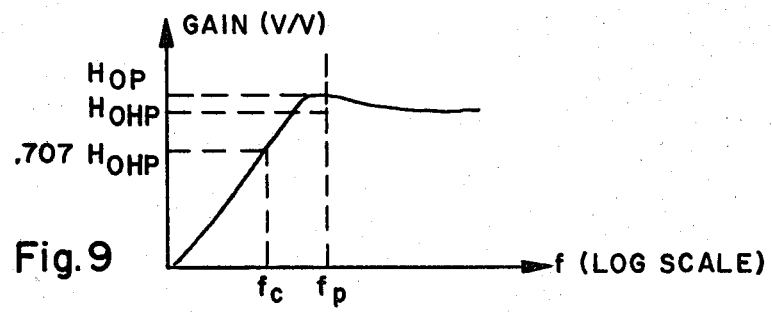
Figure 10:
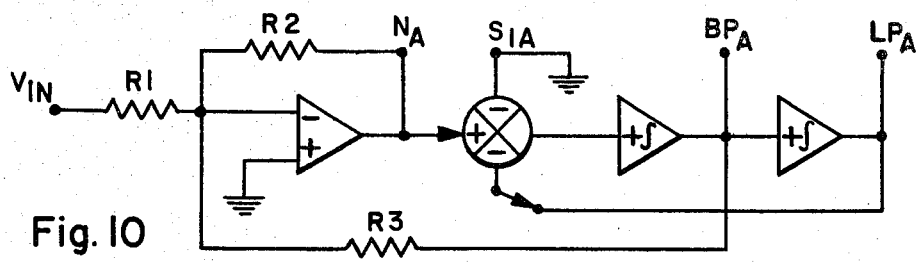
FIGS. 10–14 are functional block diagram of various modes in which the active filter of FIG. 3 can be configured.
Figure 11:
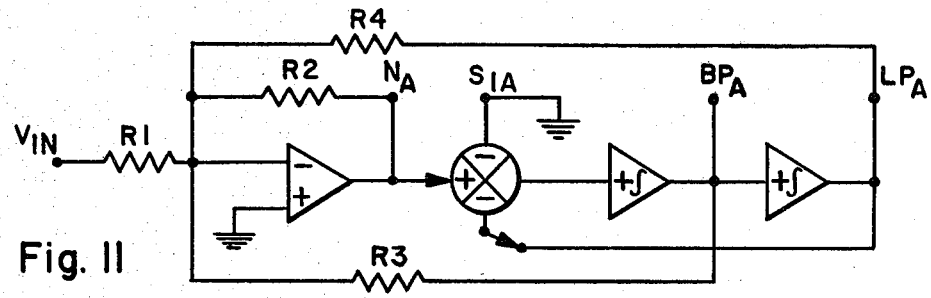
Figure 12:
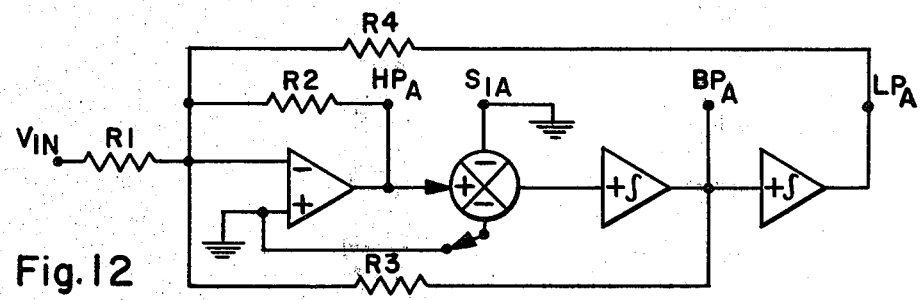
Figure 13:
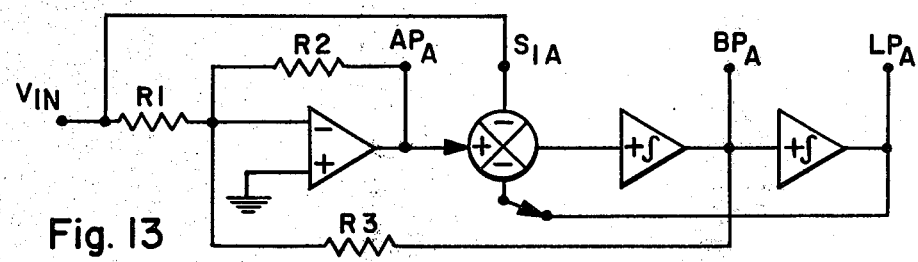
Figure 14:
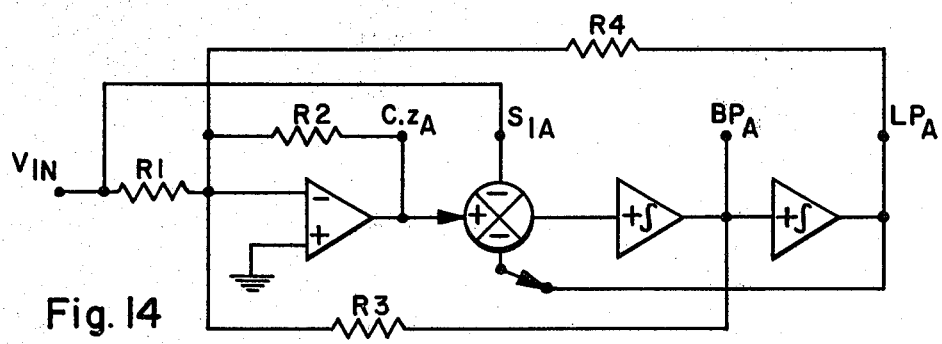

$H_{OHP}$ = The gain in (V/V) of the high pass output of each filter block f→($f_{clk}$/2) (FIG. 9).

$$f_c = f_o \cdot \sqrt{\left(1 - \frac{1}{2Q_p^2}\right) + \sqrt{\left(1 - \frac{1}{2Q_p^2}\right)^2 + 1}}$$

$$f_p = f_o \cdot \sqrt{1 - \frac{1}{2Q_p^2}}$$

$$H_{OP} = H_{OHP} \times \frac{1}{\frac{1}{Q_p} \sqrt{1 - \frac{1}{4Q_p^2}}}$$

$Q_z$ = The quality factor of the second order function complex zero pair, if any. ($Q_z$ is a parameter used when an all pass output is sought and unlike $Q_p$ it cannot be directly measured).

$f_z$ = The center frequency of the second order function complex zero pair, if any. If $f_z$ is different from $f_o$, and if the $Q_z$ is quite high it can be observed as a notch frequency at the all pass output.

$f_{notch}$ = The notch frequency observed at the notch output of each filter block.

$H_{ON1}$ = The notch output gain as f→0Hz.

$H_{ON2}$ = The notch output gain as f→$f_{clk}$/2.

The active filter of the present invention is a sampled data filter. A time domain approach is appropriate to describe its transfer functions. However, since the active filter of the present invention closely approximates the operation of continuous filters, the former can be discussed on the basis of the frequency domain. The following illustrations of the various modes in which the present invention can be configured refer to one of the identical filter building blocks 22 and 24. Each of these filter building blocks can produce a full second order function. As previously mentioned, up to fourth order functions can be performed by cascading the building blocks 22 and 24. Functional block diagrams for each of the modes are shown in FIGS. 10–14.

| Modes of Operation | |
|---|---|
| Mode 1: | Notch 1, band pass, low pass outputs: $f_{notch} = f_o$ (See FIG. 10) |
| $f_o$ | = center frequency of the complex pole pair = $\frac{f_{clk}}{100}$ or $\frac{f_{clk}}{50}$ |
| *$f_{notch}$ = | center frequency of the imaginary zero pair = $f_o$. Circuit dynamics: $H_{OLP} = \frac{H_{OBP}}{Q_o}$ or $H_{OBP} =$ $H_{OLP} \times Q_o = H_{ON} \times Q_o$. The above expressions determine the swing at each output as a function of the desired $Q_o$ of the second order function. |

-continued

Modes of Operation $H_{OLP}$ = low pass gain as $f \to 0 = -\frac{R_2}{R_1}$ $H_{OBP}$ = band pass gain at $f = f_o = -\frac{R_3}{R_1}$ $H_{ON}$ = notch output gain as $\left.\begin{array}{l}f \to 0 \\ f \to \infty\end{array}\right\} -\frac{R_2}{R_1}$ $Q_p = \frac{f_o}{BW} = \frac{R_3}{R_2}$ = quality factor of the complex pole pair.

BW = the −3dB bandwidth of the band pass output.

Mode 2: Notch 2, band pass, low pass: $f_{notch} < f_o$
(See FIG. 11)

$f_o$ = center frequency = $\frac{f_{clk}}{100} \sqrt{\frac{R_2}{R_4} + 1}$ or $\frac{f_{clk}}{50} \sqrt{\frac{R_2}{R_4} + 1}$ $f_{notch} = \frac{f_{clk}}{100}$ or $\frac{f_{clk}}{50}$ $Q_p$ = quality factor of the complex pole pair = $\sqrt{\frac{R_2/R_4 + 1}{R_2/R_3}}$ $H_{OLP}$ = low pass output gain as $f \to 0 = -\frac{R_2/R_1}{R_2/R_4 + 1}$ $H_{OBP}$ = band pass output gain at $f = f_o = -R_2/R_4$ $H_{ON1}$ = notch output gain as $f \to 0 = -\frac{R_2/R_1}{R_2/R_4 + 1}$ $H_{ON2}$ = notch output gain as $f \to \frac{f_{clk}}{2} = -R_2/R_1$ Filter dynamics: $H_{OBP} = Q_p \sqrt{H_{OLP} H_{ON2}} = Q_p \sqrt{H_{ON1} H_{ON2}}$ Mode 3: High pass, band pass, low pass outputs.
(See FIG. 12)

$f_o = \frac{f_{clk}}{100} \times \sqrt{\frac{R_2}{R_4}}$ or $\frac{f_{clk}}{50} \times \sqrt{\frac{R_2}{R_4}}$ $Q_p$ = quality factor of the complex pole pair = $\sqrt{\frac{R_2}{R_4}} \times \frac{R_3}{R_2}$ $H_{OHP}$ = high pass gain as $f \to \frac{f_{clk}}{2} = -\frac{R_2}{R_1}$ $H_{OBP}$ = band pass gain at $f = f_o = -\frac{R_3}{R_1}$ $H_{OLP}$ = low pass gain as $f \to 0 = -\frac{R_4}{R_1}$ Circuit dynamics: $\frac{R_2}{R_4} = \frac{H_{OHP}}{H_{OLP}}$ ; $H_{OBP} = \sqrt{H_{OHP} \times H_{OLP}} \times Q_p$ -continued Modes of Operation Mode 4: All pass, band pass, low pass outputs.
(See FIG. 13)

$f_o$ = center frequency = $\frac{f_{clk}}{100}$ or $\frac{f_{clk}}{50}$ ; $f_z$ = center frequency of the complex zero pair $\simeq f_0$ $Q_p = \frac{f_o}{BW} = \frac{R_3}{R_2}$ ; $Q_z$ = quality factor of complex zero pair = $\frac{R_3}{R_1}$. For AP output make $R_1 = R_2$ $H_{OAP}$ = all pass gain of $0 < f < \frac{f_{clk}}{2} = -\frac{R_2}{R_1} = -1$ $H_{OLP}$ = low pass gain as $f \to 0 = -\left(\frac{R_2}{R_1} + 1\right) = -2$ $H_{OBP}$ = band pass gain at $= f_o = -\frac{R_3}{R_2}\left(1 + \frac{R_2}{R_1}\right) = -2\frac{R_3}{R_2}$ Circuit dynamics: $H_{OBP} = (H_{OLP}) \times Q_o = H_{OAP} \times Q_o$ Due to the sampled data nature of the filter a slight mismatch of $f_z$ and $f_o$ occurs causing a .4dB peaking around $f_o$ of the all pass filter amplitude response (which theoretically should be a straight line).

Mode 5: Numerator complex zeros, band pass, low pass outputs. (See FIG. 14)

$f_o = \sqrt{1 + \frac{R_2}{R_4}} \times \frac{f_{clk}}{100}$ or $\sqrt{1 + \frac{R_2}{R_4}} \times \frac{f_{clk}}{50}$ $f_z = \sqrt{1 - \frac{R_1}{R_4}} \times \frac{f_{clk}}{100}$ or $\sqrt{1 - \frac{R_1}{R_4}} \times \frac{f_{clk}}{50}$ $Q_p = \sqrt{1 + R_2/R_4} \times \frac{R_3}{R_2}$ $Q_z = \sqrt{1 - R_1/R_4} \times \frac{R_3}{R_1}$ $H_{Oz1}$ = gain at C · z output as $f \to 0 Hz = \frac{R_2(R_4 - R_1)}{R_1(R_2 + R_4)}$ $H_{Oz2}$ = gain at C · z output as $f \to \frac{f_{clk}}{2} = \frac{R_2}{R_1}$ $H_{OBP} = \left(\frac{R_2}{R_1} + 1\right) \times \frac{R_3}{R_2}$ $H_{OLP} = \left(\frac{R_2 + R_1}{R_2 + R_4}\right) \frac{R_4}{R_1}$ The present invention thus provides a general purpose active filter in a low cost, small size, monolithic IC. Tuning is easily accomplished by connecting appropriately valued precision external resistors and/or by setting the frequencies of the external clock signals ($CLK_A$ and $CLK_B$ in FIG. 3) as required. The interconnection of switches along with the op amp $A_2$ (FIG. 5) gives both summer and positive integrator functions.

The availability of two summers in each filter block provides additional flexibility in configuring the blocks. The chip also provides all pass filtering capability in a low cost package and is thus well suited for phase correcting functions in modems used in communications systems.

Having described preferred embodiments of the active filter, it should be apparent to those skilled in the art that our invention may be modified in both arrangement and detail. Therefore, the protection afforded our invention should be limited only in accordance with the scope of the following claims.

We claim:

1. A monolithic IC general purpose active filter comprising:

a pair of filter building blocks each including a pair of serially connected summers and a pair of serially connected switched capacitor positive integrators connected to the serial output of the summers;

clock interface means for receiving and conditioning first and second external clock signals and for driving the switched capacitor positive integrators of each filter building block with a corresponding one of the first and second conditioned clock signals; and input/output means interconnected between the summers, the integrators and the clock interface means for permitting each filter building block to be configured and the center frequency thereof tuned according to at least one of the resistance ratios of externally applied resistors and the frequency of one of the first and second clock signals.

2. An active filter according to claim 1 wherein the filter building blocks and the clock interface means are made of MOS components.

3. An active filter according to claim 1 wherein the filter building blocks, the clock interface means and the input/output means are mounted in a dual-in-line package.

* * * * *